United States Patent [19]

Maryatt

[11] Patent Number: 4,901,853

[45] Date of Patent: Feb. 20, 1990

[54] SUBSTRATE TRANSPORT BOX

[75] Inventor: Christopher J. Maryatt, Santa Clara, Calif.

[73] Assignee: Avantek, Inc., Milpitas, Calif.

[21] Appl. No.: 358,404

[22] Filed: May 26, 1989

[51] Int. Cl.$^4$ .............................................. B65D 73/02
[52] U.S. Cl. .................................... 206/334; 206/328; 206/454; 206/560
[58] Field of Search ............... 206/454, 334, 329, 328, 206/560, 558, 557

[56] References Cited

U.S. PATENT DOCUMENTS

| | | | |
|---|---|---|---|
| 1,016,529 | 9/1910 | Teets et al. | 206/591 |
| 2,110,299 | 3/1938 | Hinkle | 206/560 |
| 2,498,042 | 11/1945 | Kolber | 206/46 |
| 2,527,541 | 8/1949 | Gibbs | 206/591 |
| 3,415,365 | 12/1966 | Faulkner | 206/62 |
| 3,497,058 | 12/1967 | Walker et al. | |
| 3,610,613 | 3/1969 | Worden | |
| 4,415,083 | 10/1981 | Kemkers | |
| 4,598,820 | 7/1986 | Murphy | 206/334 |
| 4,671,410 | 6/1987 | Hansson et al. | |
| 4,815,596 | 3/1989 | Reid | 206/334 |

*Primary Examiner*—Paul T. Sewell
*Assistant Examiner*—Jacob K. Ackun, Jr.
*Attorney, Agent, or Firm*—Philip M. Shaw, Jr.

[57] ABSTRACT

A conductive device for protecting and securing electrical circuit substrates during manufacture and shipment which includes a plurality of spring driven pin slides anchored on a common support member, each slide securing a substrate against a corresponding substrate stop.

11 Claims, 2 Drawing Sheets

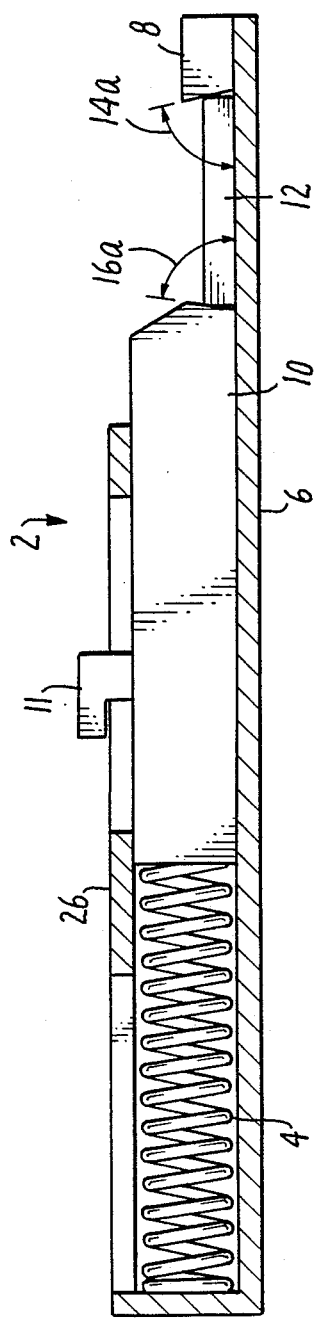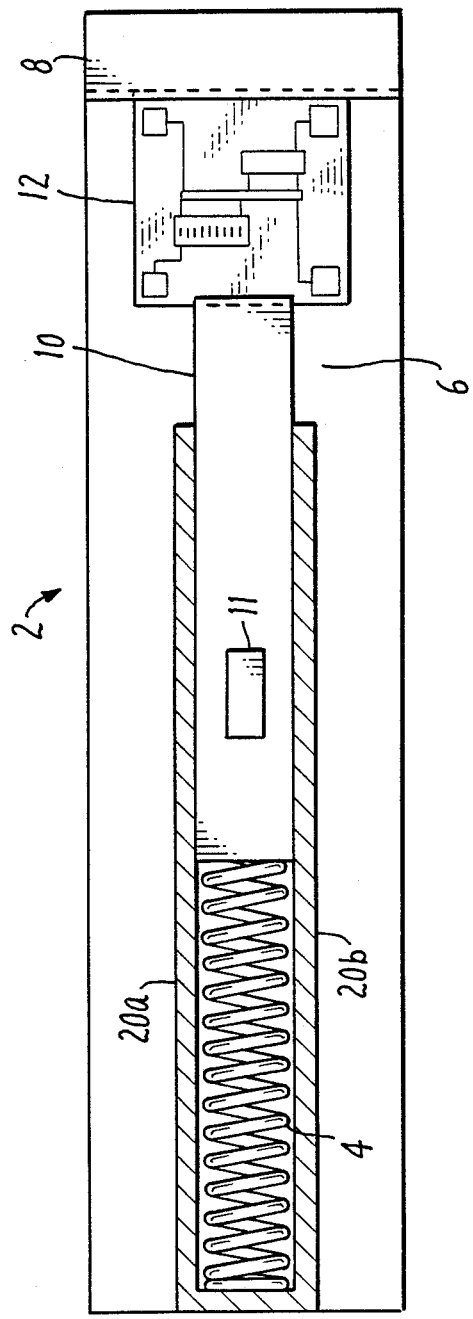

SUBSTRATE TRANSPORT BOX

TECHNICAL FIELD

This invention pertains to a carrier for electronic components during the assembly process and more particularly to a carrier for transporting wire bonded circuits, substrates and die carriers through all phases of manufacturing.

BACKGROUND ART

During the assembly of delicate integrated circuit components into various circuits it is necessary to transport the components from one work area to another and also to store the components. They are highly sensitive to both physical and electrical shocks which can damage them. There is a great need for a suitable, cost effective mechanism for storing and transporting such delicate, integrated circuits.

SUMMARY AND OBJECTS OF THE INVENTION

The primary object of the invention is to provide a means for transporting electrical circuit substrates through all phases of manufacture, from assembly and testing to interplant and customer shipment, with minimum substrate damage.

These objects are achieved by the present invention of a substrate transport box comprising a conductive planar support on which a spring is anchored so that its line of compression is parallel with the plane of the support. A pin slide is attached to the spring so that it is free to move across the surface of the support along the compression line of the spring. A substrate stop is mounted on the support along the compression line of the spring.

The spring driven pin slide and the substrate stop are each angularly shaped in order to cooperatively force the substrate against the surface of the support.

The foregoing and other objectives, features and advantages of the invention will be more readily understood upon consideration of the following detailed description of certain preferred embodiments of the invention, taken in conjunction with the accompanying drawings.

BRIEF DESCRIPTION OF THE DRAWINGS

FIG. 1 is a side view of the invention.
FIG. 2 is a top view of the invention.

BEST MODE FOR CARRYING OUT THE INVENTION

Figure 3:
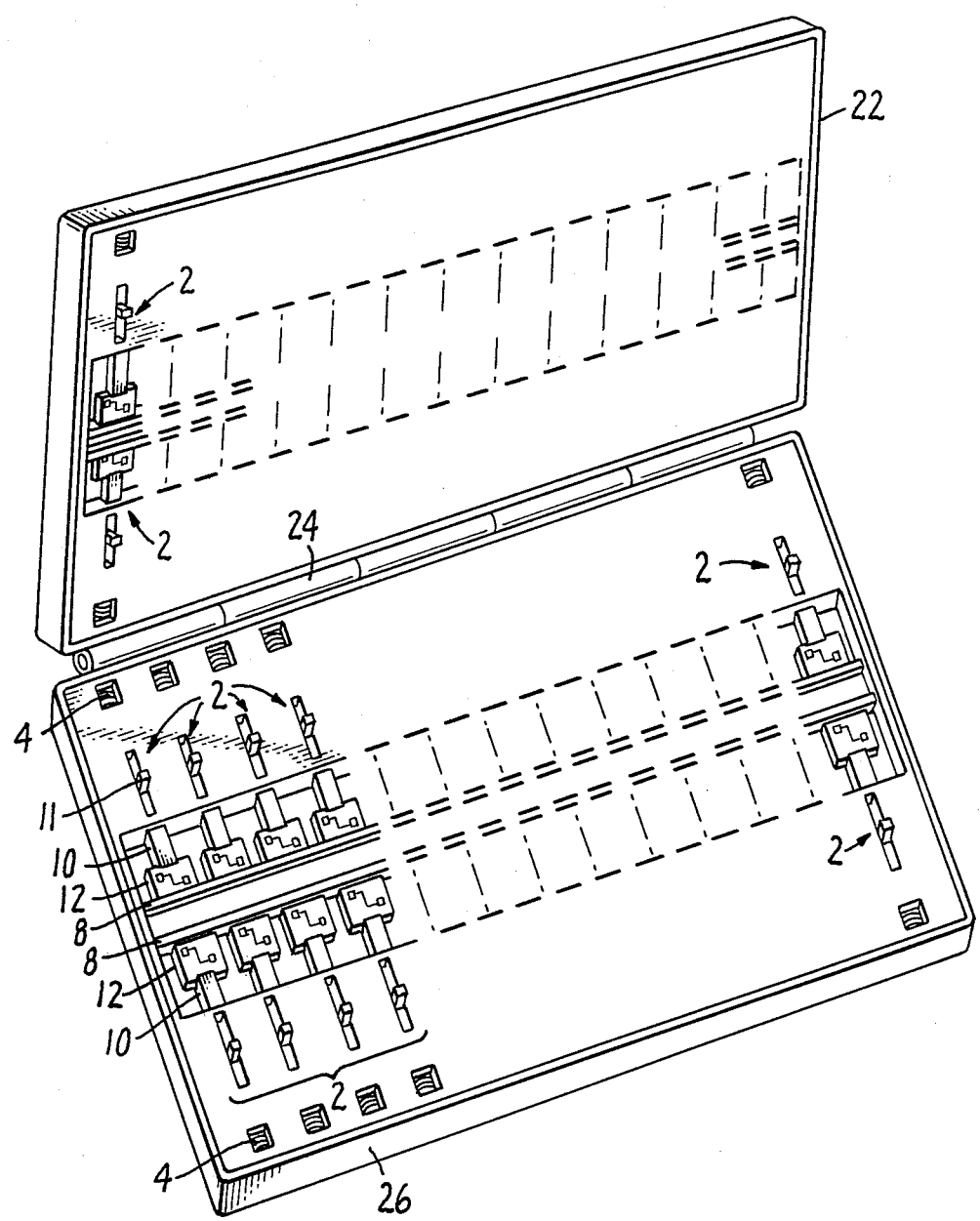
FIG. 3 is a top, perspective view of an alternate embodiment of the invention.

Fig. 1 shows a typical embodiment of the transport device 2 according to the invention. A spring 4 is mounted in a hollow sleeve 26 which is attached to a conductive support member 6, so that the spring's line of compression is parallel to the plane of the support member 6. The spring 4 is attached to a pin slide 10 having a perpendicularly projecting slide pull 11 and which is free to slide along the surface of the support member 6 in the compression line of the spring 4. A substrate stop 8 is mounted on the support member 6 in the compression line of the spring 4, close enough to the spring so that when no substrate is in the device the pin stop 10 is driven by the spring 4 to contact the substrate stop 8.

In the preferred embodiment the angle 16a formed by the pin slide 10 and the support member 6 is acute, and the angle 14a formed by the substrate stop 8 and the support member 6 is acute.

In operation, the plunger 10 is physically forced back into the sleeve 26 and the substrate 12 is loaded onto the support member 6. When the plunger 10 is released, the force of the spring 4 causes the plunger 10 to push the substrate 12 into the substrate stop 8. The angular cuts of the pin slide 10 and the substrate stop 8 serve to force the electrical circuit substrate 12 onto the surface of the support member.

In the preferred embodiment the support member 6, pin slide 10, and stop 8 are made of conductive polycarbonate plastic to reduce the possibility of electrical shock to the substrate 12.

In an alternate embodiment, spring guides 20a, 20b, as shown in FIG. 2 or an equivalent means are employed to keep the spring 4 from deviating from its line of compression.

In an alternate embodiment, as shown in FIG. 3 multiple devices 2 are constructed on a single support member 6 which constitutes the bottom of a box housing 26. A cover 22 is hinged at 24 to the housing 26 to provide additional protection during transport.

While the substrate transport box could have a number of possible constructions and dimensions, in the preferred embodiment the housing 26 has a height of about ½ inch, a length of about 7 inches, and a width of about 4 inches. A total of 52 devices 2 are mounted on the support 6 in two rows of 26 devices each. The acute angles of the faces on the pin slide and stop are at 80° from the horizontal and will accommodate a circuit 0.005 to 0.055 inches thick. The conductive polycarbonate plastic has a surface resistivity of $10^3$ to $10^6$ ohms per square.

Although the present invention has been shown and described with respect to preferred embodiments, various changes and modifications which are obvious to a person skilled in the art to which the invention pertains are deemed to lie within the spirit and scope of the invention.

What is claimed is:

1. A device for securing and protecting generally planar electrical circuit substrates during transport or storage comprising:
    a planar support member;
    a substrate stop mounted on the support member and having a face for contacting an edge of the electrical circuit substrate;
    resilient means mounted on the support member opposite to the substrate stop for resiliently biasing the electrical circuit substrate against the support member and the substrate stop, and wherein the substrate stop and the resilient means cooperate together to force the electrical circuit substrate against the planar support member while simultaneously preventing lateral movement of the electrical circuit substrate relative to the planar support member.

2. A substrate transport device as recited in claim 1, wherein the resilient means comprises:
    a spring, the spring being anchored to the support member and positioned so that its line of compression is parallel to the plane containing the support member; and a pin slide having an face which contacts the electrical circuit substrate, the slide being attached to the spring, the slide being free to move across the surface of the support member driven by the force exerted on it by the spring.

3. A substrate transport device as claimed in claim 2 wherein the planar support member, the pin slide and the substrate stop are conductive.

4. A substrate transport device as claimed in claim 2 wherein the planar support member, the pin slide and the substrate stop are made of polycarbonate plastic.

5. A device for securing and protecting generally planar electrical circuit substrates during transport or storage comprising:
- a planar support member;
- a substrate stop mounted on the support member and having an face for contacting an edge of the electrical circuit substrate;
- resilient means mounted on the support member opposite to the substrate stop for resiliently biasing the electrical circuit substrate against the support member and the substrate stop, wherein the resilient means includes:
- a spring, the spring being anchored to the support member and positioned so that its line of compression is parallel to the plane containing the support member; and
- a pin slide having an face which contacts the electrical circuit substrate, the slide being attached to the spring, the slide being free to move across the surface of the support member driven by the force exerted on it by the spring and wherein the pin slide face forms an acute angle with the support member.

6. A device for securing and protecting generally planar electrical circuit substrates during transport or storage comprising:
- a planar support member;
- a substrate stop mounted on the support member and having an face for contacting an edge of the electrical circuit substrate, wherein the substrate stop face forms an acute angle with the support member;
- resilient means mounted on the support member opposite to the substrate stop for resiliently biasing the electrical circuit substrate against the support member and the substrate stop, wherein the resilient means includes:
- a spring, the spring being anchored to the support member and positioned so that its line of compression is parallel to the plane containing the support member; and
- a pin slide having an end face which contacts the electrical circuit substrate, the slide being attached to the spring, the slide being free to move across the surface of the support member driven by the force exerted on it by the spring.

7. A substrate transport device as claimed in claim 2, further comprising a means for keeping the spring in line with the pin slide, the electrical circuit substrate, and the substrate stop.

8. A substrate transport device as claimed in claim 1, further comprising:
- a cover; and
- a hinging means for connecting the cover to the support member, allowing the electrical circuit substrate to be fully enclosed during transport.

9. A substrate transport device as claimed in claim 1, further comprising:
- a plurality of substrate stops and corresponding resilient biasing means mounted on the planar support member for transporting a plurality of substrates;
- a housing enclosing the planar support member;
- a cover for the housing; and
- a hinging means for connecting the cover to the housing, allowing the electrical circuit substrate to be fully enclosed during transport.

10. A device as claimed in claim 9 wherein the planar support member is one wall of the housing.

11. A device for securing and protecting generally planar electrical circuit substrates during transport or storage comprising:
- a planar support member;
- a substrate stop mounted on the support member and having a face for contacting an edge of the electrical circuit substrate;
- resilient means, mounted on the support member opposite to the substrate stop and including a slide member having a face which contacts the electrical circuit substrate, for resiliently biasing the slide member face against the electrical circuit substrate to simultaneously force it against the support member and the substrate stop; and
- wherein at least one of the substrate stop face and the slide member face forms an acute angle with the planar support member.

* * * * *